United States Patent [19]

Sadou

[11] 4,286,116
[45] Aug. 25, 1981

[54] DEVICE FOR THE PROCESSING OF VOICE SIGNALS

[75] Inventor: Jean-Claude B. Sadou, Paris, France

[73] Assignee: Thomson-CSF, Paris, France

[21] Appl. No.: 78,805

[22] Filed: Sep. 25, 1979

[30] Foreign Application Priority Data

Sep. 29, 1978 [FR] France ................. 78 27922

[51] Int. Cl.$^3$ ............................. H04B 15/00
[52] U.S. Cl. ............................. 179/1 P
[58] Field of Search ............. 179/1 P, 1 VC, 1 SA; 455/72, 116, 212, 213, 221, 222, 225, 283, 284, 287, 296, 303, 304, 305, 306; 328/165, 167; 333/14

[56] References Cited

U.S. PATENT DOCUMENTS

| 3,126,449 | 3/1964 | Shirman .............. | 179/1 P |
|---|---|---|---|
| 3,872,250 | 3/1975 | Coulter .............. | 179/1 SA |
| 3,902,123 | 8/1975 | Oomen .............. | 455/221 |
| 3,947,636 | 3/1976 | Edgar .............. | 455/303 |
| 3,952,158 | 4/1976 | Kyle et al. .............. | 179/1 P |
| 4,143,325 | 3/1979 | Kahn .............. | 179/1 P |
| 4,143,333 | 3/1979 | Jacobsen et al. .............. | 328/167 |

Primary Examiner—Bernard Konick
Assistant Examiner—Randall P. Myers
Attorney, Agent, or Firm—Roland Plottel

[57] ABSTRACT

A processing device transmits speech signals of constant amplitude during periods of voice activity and interrupts transmission outside these periods, so that noise is not transmitted. To this end the processing device comprises an amplitude-compressing device preceded by a voice activity detector comprising a delay line in series with an electronic switch and a speed - noise discriminator having a common input with the delay line for receiving the voice signals. The switch is controlled by the output signal of the discriminator in such a way that it only permits the passage of the voice signals corresponding to the periods of voice activity.

3 Claims, 1 Drawing Figure

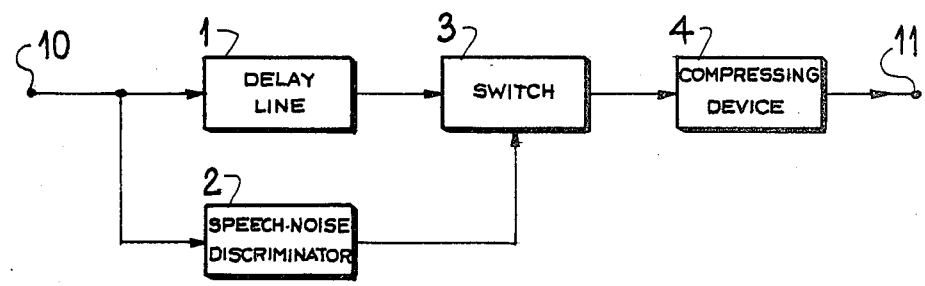

DEVICE FOR THE PROCESSING OF VOICE SIGNALS

BACKGROUND OF THE INVENTION

The present invention relates to devices for processing voice signals from a transmitter having means for compressing their amplitude.

During the standard transmission of a speech signal the ratio between the peak power and the average power of the words is of the order of 15 dB, so that there is a poor transmission balance. To obviate this it is known to use devices for compressing the amplitude of the transmitted speech signal.

All the devices used (compression loop, saturated amplifier, etc.) strongly amplify the noise during the periods of silence of the transmitted speech, which makes reception very unpleasant.

BRIEF SUMMARY OF THE INVENTION

The problem of the invention is to obviate this disadvantage.

According to the invention this problem is solved by a voice signal transmitting device having an amplitude compression device for supplying amplitude-compressed signals and means for detecting voice activity in order to interrupt the supply of compressed signals when voice activity is not present.

DESCRIPTION OF THE DRAWING AND PREFERRED EMBODIMENTS

The invention is described in greater detail hereinafter relative to a non-limitative embodiment and with reference to the attached drawing.

The drawing shows an input terminal 10 receiving a voice signal and which is connected in parallel to the input of a delay line 1 and to the input of a speechnoise discriminator 2. At its input an electronic switch 3 receives the output signal from the delay line 1 and is controlled by the outer signal of discriminator 2. Delay line 1, discriminator 2 and electronic switch 3 constitute a voice activity detector. This electronic switch 3 is connected to the output terminal 11 of the voice signal processing device across an amplitude compressing device 4.

The device functions in the following manner.

The speech—noise discriminator 2 supplies at its output a signal which closes the electronic switch 3, when the input signal received on terminal 10 is a speech signal. However, as the control of electronic switch 3 takes place with a time lag $T_1$ (time necessary for the processing of its control signal) compared with the input signal (received on terminal 10) the delay line 1 must have a delay equal to $T_1$, so that electronic switch 3 is only closed when a speech signal appears at its input. The output signal of electronic switch 3 is then amplified and compressed by the amplitude compressing device 4 which will then supply a speech signal of constant amplitude to output terminal 11.

This device supplies speech signals of constant amplitude during the period of vocal activity, but supplies no signal (except for the noise of this amplitude compressor) outside these periods.

The invention is not limited to the embodiment described and represented hereinbefore and in particular the device can be constructed in accordance with the following variants.

The compressing device 4 can either be a compression loop with a rapid resensitizing constant, whereby the signals are amplified up to a predetermined peak value imposed by the compression loop, or the saturated amplifier.

The speech compression device 4 can advantageously be inserted in series between the delay line 1 and the electronic switch 3, making it possible to eliminate the noise of said device outside the voice activity periods.

Such devices can be in particular used in transmitters transmitting speech signals.

What is claimed is:

1. Apparatus for processing input signals which comprise voice signals and, during periods of voice inactivity, unwanted noise signals, said apparatus functioning to remove substantially all of said noise signals and comprising:
    (a) means, connected to the source of said input signals, for generating a control signal only when said input signals comprise voice signals;
    (b) switching means, connected between the source of said input signals and the output of the apparatus and controlled by said control signal, for closing a path between said source and said output;
    (c) a delay line interposed between the source of said input signals and the input to said switching means, said delay line having a delay T, substantially equal to the response time of said control signal generating means; and
    (d) an amplitude compression device in the path between the source of said input signals and said output, downstream of said delay line.

2. The apparatus according to claim 1 wherein said amplitude compression device is also downstream of said switching means.

3. The apparatus according to claim 1 wherein said amplitude compression device is upstream of said switching means.

* * * * *